(12) United States Patent
Endo et al.

(10) Patent No.: US 9,139,900 B2
(45) Date of Patent: Sep. 22, 2015

(54) INDIUM TARGET AND MANUFACTURING METHOD THEREOF

(75) Inventors: Yousuke Endo, Kitaibaraki (JP); Masaru Sakamoto, Kitaibaraki (JP)

(73) Assignee: JX Nippon Mining Metals Corporation, Tokyo (JP)

( * ) Notice: Subject to any disclaimer, the term of this patent is extended or adjusted under 35 U.S.C. 154(b) by 1 day.

(21) Appl. No.: 13/504,329

(22) PCT Filed: Jul. 7, 2011

(86) PCT No.: PCT/JP2011/065585
§ 371 (c)(1),
(2), (4) Date: Apr. 26, 2012

(87) PCT Pub. No.: WO2012/117579
PCT Pub. Date: Sep. 7, 2012

(65) Prior Publication Data
US 2013/0037408 A1    Feb. 14, 2013

(30) Foreign Application Priority Data
Mar. 1, 2011   (JP) .................................. 2011-043954

(51) Int. Cl.
*C23C 14/00* (2006.01)
*C23C 14/34* (2006.01)
*H01J 37/34* (2006.01)

(52) U.S. Cl.
CPC ......... *C23C 14/3414* (2013.01); *H01J 37/3414* (2013.01); *H01J 37/3426* (2013.01); *Y10T 29/49991* (2015.01)

(58) Field of Classification Search
CPC .................................................... H01J 37/3426
USPC ......................................... 204/192.25, 192.1
See application file for complete search history.

(56) References Cited

U.S. PATENT DOCUMENTS

| | | | |
|---|---|---|---|
| 3,046,651 A | | 7/1962 | Olmon et al. |
| 4,124,474 A | * | 11/1978 | Bomchil et al. ......... 204/192.13 |
| 5,054,195 A | | 10/1991 | Keck et al. |
| 5,269,453 A | | 12/1993 | Melton et al. |
| 5,630,918 A | | 5/1997 | Takahara et al. |
| 6,719,034 B2 | | 4/2004 | Heck et al. |

(Continued)

FOREIGN PATENT DOCUMENTS

| | | |
|---|---|---|
| CN | 102644053 A | 8/2012 |
| DE | 10063383 C1 | 3/2002 |

(Continued)

OTHER PUBLICATIONS

Machine Translation of JP2010024474A.*

(Continued)

*Primary Examiner* — Keith Hendricks
*Assistant Examiner* — Timon Wanga
(74) *Attorney, Agent, or Firm* — Nields, Lemack & Frame, LLC

(57) ABSTRACT

The present invention provides an indium target and manufacturing method thereof, where deposition rate is high, initial discharge voltage is low, and deposition rate and discharge voltage, from the start of sputtering to the end of sputtering, are stable. In the indium target, an aspect ratio (length of longer direction/length of shorter direction) of crystal particle, observed from cross-section direction of the target, is 2.0 or less.

13 Claims, 3 Drawing Sheets

(56) References Cited

U.S. PATENT DOCUMENTS

| | | |
|---|---|---|
| 2003/0089482 A1 | 5/2003 | Heck et al. |
| 2005/0029675 A1 | 2/2005 | Hua |
| 2005/0269385 A1 | 12/2005 | Chen et al. |
| 2008/0271779 A1 | 11/2008 | Miller et al. |
| 2009/0065354 A1 | 3/2009 | Kardokus et al. |
| 2009/0250337 A1 | 10/2009 | Simons et al. |
| 2009/0277777 A1 | 11/2009 | Schultheis et al. |
| 2010/0099214 A1 | 4/2010 | Buquing |
| 2010/0165585 A1 | 7/2010 | Lin et al. |
| 2011/0067997 A1* | 3/2011 | Nguyen et al. ........... 204/192.25 |
| 2011/0089030 A1 | 4/2011 | Juliano et al. |
| 2011/0155560 A1* | 6/2011 | Kuramochi et al. ....... 204/192.1 |
| 2012/0213917 A1 | 8/2012 | Simons et al. |
| 2012/0273348 A1 | 11/2012 | Endo et al. |
| 2013/0105311 A1 | 5/2013 | Maekawa et al. |
| 2013/0143069 A1 | 6/2013 | Endo et al. |
| 2013/0153414 A1 | 6/2013 | Endo et al. |
| 2013/0270108 A1 | 10/2013 | Endo et al. |

FOREIGN PATENT DOCUMENTS

| | | | |
|---|---|---|---|
| EP | 2287356 A1 | | 2/2011 |
| JP | 57-185973 A | | 11/1982 |
| JP | 58-145310 A | | 8/1983 |
| JP | 63-111172 A | | 5/1988 |
| JP | 63-44820 B2 | | 9/1988 |
| JP | 3-99741 A | | 4/1991 |
| JP | 4-301074 A | | 10/1992 |
| JP | 5-214519 A | | 8/1993 |
| JP | 6-287661 A | | 10/1994 |
| JP | 8-60352 A | | 3/1996 |
| JP | 8-218165 A | | 8/1996 |
| JP | 8-281208 A | | 10/1996 |
| JP | 9-25564 A | | 1/1997 |
| JP | 10-280137 A | | 10/1998 |
| JP | 11-236664 A | | 8/1999 |
| JP | 2003-89869 A | | 3/2003 |
| JP | 2003-136190 A | | 5/2003 |
| JP | 2003-183820 A | | 7/2003 |
| JP | 2003-533589 A | | 11/2003 |
| JP | 2004-131747 A | | 4/2004 |
| JP | 2005-2364 A | | 1/2005 |
| JP | 2006-102807 A | | 4/2006 |
| JP | 2006-322039 A | | 11/2006 |
| JP | 2008-523251 A | | 7/2008 |
| JP | 2009-242882 A | | 10/2009 |
| JP | 2010-24474 A | | 2/2010 |
| JP | 2010024474 A | * | 2/2010 |
| JP | 2011-236445 A | | 11/2011 |
| JP | 4837785 B1 | | 12/2011 |
| JP | 2012-172265 A | | 9/2012 |
| TW | I310409 B | | 6/2009 |
| WO | 01/73156 A2 | | 10/2001 |
| WO | 2012/029364 A1 | | 3/2012 |
| WO | 2014/030362 A1 | | 2/2014 |

OTHER PUBLICATIONS

English translation of the Written Opinion mailed Aug. 9, 2011 in corresponding PCT application No. PCT/JP2011/065585.
English translation of the International Preliminary Report on Patentability transmitted Sep. 12, 2013 in corresponding PCT application No. PCT/JP2011/065585.
English translation of the International Search Report mailed Sep. 11, 2012 in co-pending PCT application No. PCT/JP2012/070766.
English translation of the Written Opinion transmitted Jun. 7, 2013 in co-pending PCT application No. PCT/JP2012/070766.
Office Action mailed Jul. 31, 2013 in co-pending U.S. Appl. No. 13/808,009.
Office Action—Restriction—mailed Sep. 27, 2013 in co-pending U.S. Appl. No. 13/504,338.
Taiwanese Communication, with English translation, dated Aug. 27, 2012 in co-pending Taiwanese patent application No. 100127178.
International Preliminary Report on Patentability mailed Mar. 14, 2013 in co-pending PCT application No. PCT/JP2011/061682.
English translation of International Search Report mailed Aug. 28, 2012 in co-pending PCT application NO. PCT/JP2012/068838.
International Search Report/Written Opinion dated Sep. 11, 2012 in co-pending PCT application No. PCT/JP2012/070766.
Office Action—Restriction—mailed May 23, 2013 in co-pending U.S. Appl. No. 13/808,009.
International Preliminary Report on Patentability mailed Feb. 28, 2013 in PCT application No. PCT/JP2011/060969.
English translation of International Search Report mailed Aug. 9, 2011 in corresponding PCT application No. PCT/JP2011/065585.
English translation of International Search Report mailed Aug. 9, 2011 in co-pending PCT application No. PCT/JP2011/065587.
English translation of International Search Report mailed Jun. 28, 2011 in co-pending PCT application No. PCT/JP2011/061682.
International Search Report mailed Aug. 28, 2012 in co-pending PCT application No. PCT/JP2012/068838.
English translation of International Search Report mailed Jun. 7, 2077 in co-pending PCT application No. PCT/JP2011/060969.
International Search Report dated Jul. 7, 2011 in corresponding PCT application No. PCT/JP2011/065585.
International Search Report dated Jul. 7, 2011 in co-pending PCT application No. PCT/JP2011/065587.
Office Action mailed Dec. 31, 2014 in co-pending U.S. Appl. No. 13/704,086.
Alloy Digest, Indium Semi-Conductor Grade (data sheet), ASM International, Mar. 1998, 2 pages.
International Preliminary Report on Patentability mailed Oct. 31, 2013 in co-pending PCT application No. PCT/JP2011/065587.
European communication mailed Jan. 2, 2014 in co-pending European patent application No. 11821381.8.
Office Action mailed Dec. 18, 2013 in co-pending U.S. Appl. No. 13/504,338.
Final Rejection mailed Feb. 12, 2014 in co-pending U.S. Appl. No. 13/808,009.
Notice of Allowance mailed Feb. 9, 2015 in co-pending U.S. Appl. No. 13/808,009.
Final Rejection mailed Jan. 28, 2015 in co-pending U.S. Appl. No. 13/809,296.
International Preliminary Report on Patentability mailed Mar. 5, 2015 in co-pending PCT application No. PCT/JP2013/052263.
Final Rejection mailed May 4, 2015 in co-pending U.S. Appl. No. 13/704,086.
Final Rejection mailed May 4, 2015 in co-pending U.S. Appl. No. 13/809,296.
Office Action—Restriction—mailed Apr. 23, 2015 in co-pending U.S. Appl. No. 13/819,499.
International Preliminary Report on Patentability mailed Jul. 17, 2014 in co-pending PCT application No. PCT/JP2012/070766.
International Search Report mailed May 7, 2013 in co-pending PCT application No. PCT/JP2013/052263.
Final Rejection mailed Jun. 16, 2014 in co-pending U.S. Appl. No. 13/504,338.
International Preliminary Report on Patentability issued Mar. 25, 2014 in co-pending PCT application No. PCT/JP2012/068838.
Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
Final Rejection mailed Sep. 22, 2014 in co-pending U.S. Appl. No. 13/504,338.
Office Action mailed Sep. 17, 2014 in co-pending U.S. Appl. No. 13/808,009.
Office Action mailed Sep. 26, 2014 in co-pending U.S. Appl. No. 13/809,296.

* cited by examiner

INDIUM TARGET AND MANUFACTURING METHOD THEREOF

TECHNICAL FIELD OF THE INVENTION

The present invention relates to a sputtering target and manufacturing method thereof. In particular, the present invention relates to an indium target and manufacturing method thereof.

BACKGROUND OF THE INVENTION

Indium is used as sputtering target for forming photoabsorption layer of Cu—In—Ga—Se system (CIGS system) thin-film solar cell.

Traditionally, as disclosed in Patent document 1, indium target is produced by attaching indium and the like, on a backing plate, and next, setting a mold on the backing plate, and then pouring indium into the mold and casting them.
(Patent documents 1) Japanese Examined Patent Publication No. 63-44820

SUMMARY OF THE INVENTION

However, there is still room for improvement, in the indium target produced by such traditional melting and casting method, with regard to deposition rate and discharge voltage.

The present invention aims to provide an indium target and manufacturing method thereof, where deposition rate is high, initial discharge voltage is low, and deposition rate and discharge voltage, from the start of sputtering to the end of sputtering, are stable.

The inventors have diligently studied to cope with the requirements, and eventually have found out, shape, size and distribution of crystal structure of the indium target, have a huge effect on the deposition rate and the discharge voltage, from the start of sputtering to the end of sputtering. That is, indium targets, where an aspect ratio (length of longer direction/length of shorter direction) of crystal particle, observed from cross-section direction of the target, is smaller than predetermined value, have higher deposition rate and lower initial discharge voltage, and also have more stable deposition rate and discharge voltage, from the start of sputtering to the end of sputtering, compared to indium target where an aspect ratio of crystal particle is larger than the predetermined value. Further, in traditional melting and casting method, indium target is provided by pouring indium into a mold and then casting by leaving it to cool. However, if the indium target, poured into the mold, is cast by leaving it to cool, structures of growing indium become large and then they become mixed structures of granular and columnar crystals. The inventors have found out, indium tile, having the crystal particle of the above aspect ratio, can be provided by rolling an indium ingot having such structures, and indium target, having the above properties, can be provided by bonding the tile on a backing plate.

The present invention, produced on the basis of the above findings, in one aspect, is an indium target, wherein an aspect ratio (length of longer direction/length of shorter direction) of crystal particle, observed from cross-section direction of the target, is 2.0 or less.

The present invention is, in one embodiment, the indium target, wherein average crystal particle size is 1 to 20 mm.

The present invention is, in another embodiment, the indium target having deposition rate of 4000 Å/min or more, under the sputtering condition of power density: 2.0 W/cm², gas pressure: 0.5 Pa, and used gas: Ar 100%.

The present invention is, in yet another embodiment, the indium target, wherein percentage of change of the deposition rate per 1 kWh of integrated electricity, from the start of sputtering to the end of sputtering, is within 0.5%, under the sputtering condition of power density: 2.0 W/cm², gas pressure: 0.5 Pa, and used gas: Ar 100%.

The present invention is, in yet another embodiment, the indium target, wherein initial discharge voltage is 350V or less, under the sputtering condition of power density: 2.0 W/cm², gas pressure: 0.5 Pa, and used gas: Ar 100%.

The present invention is, in yet another embodiment, the indium target, wherein percentage of change of the discharge voltage per 1 kWh of integrated electricity, from the start of sputtering to the end of sputtering, is within 0.2%, under the sputtering condition of power density: 2.0 W/cm², gas pressure: 0.5 Pa, and used gas: Ar 100%.

The present invention is, in yet another embodiment, the indium target, wherein sum density, of one or more metals selected from the group consisting of Cu, Ni and Fe, is 100 wtppm or less.

The present invention, in another aspect, is a method for manufacturing an indium target comprising:
 a step for forming an indium ingot by pouring raw indium into a mold and then cooling the raw indium,
 a step for forming an indium tile by rolling the indium ingot, and
 a step for bonding the indium tile.

Advantageous Effect of the Invention

The present invention can provide an indium target and manufacturing method thereof, where deposition rate is high, initial discharge voltage is low, and deposition rate and discharge voltage, from the start of sputtering to the end of sputtering, are stable.

DESCRIPTION OF THE PREFERRED EMBODIMENTS

Figure 1:
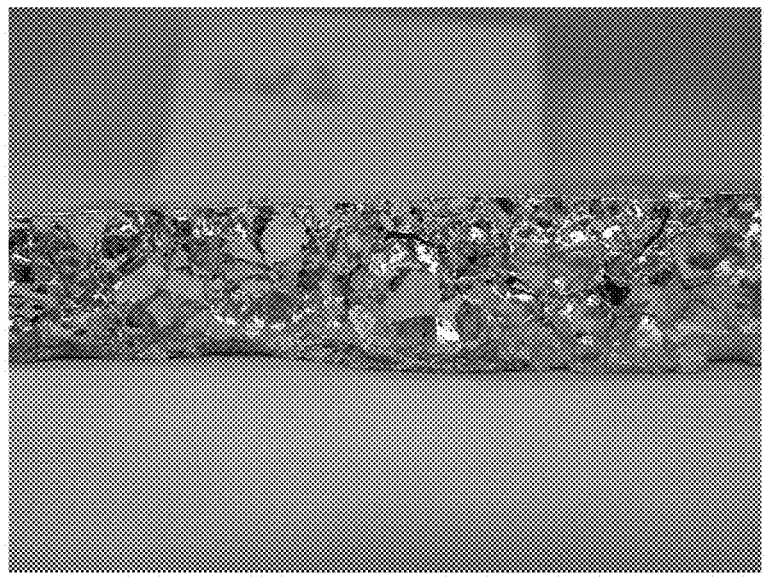
FIG. 1 indicates an example of cross-section photo of the indium target of the present invention.
Figure 2:
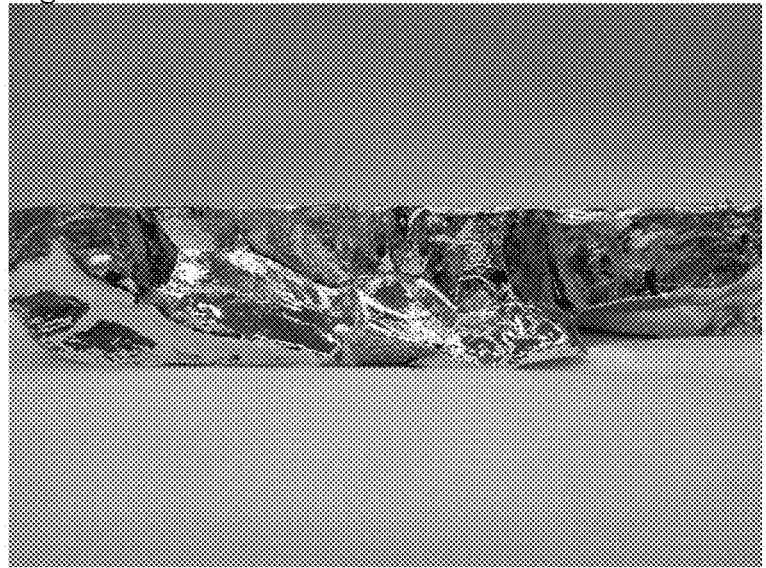
FIG. 2 indicates an example of cross-section photo of the indium target formed by a traditional casting method.
Figure 3:
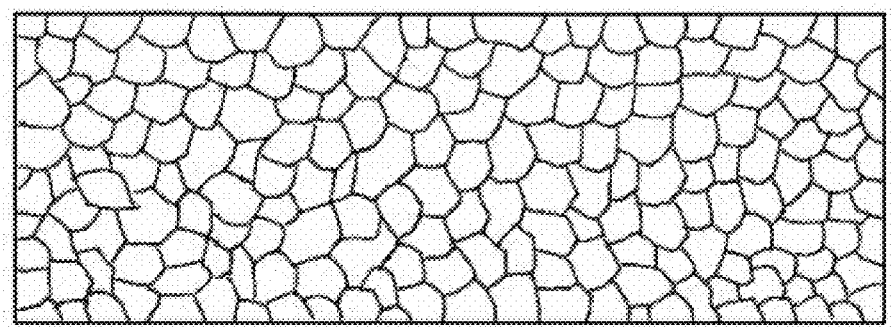
FIG. 3 indicates a cross-section view showing a frame format of the indium target according to FIG. 1.
Figure 4:
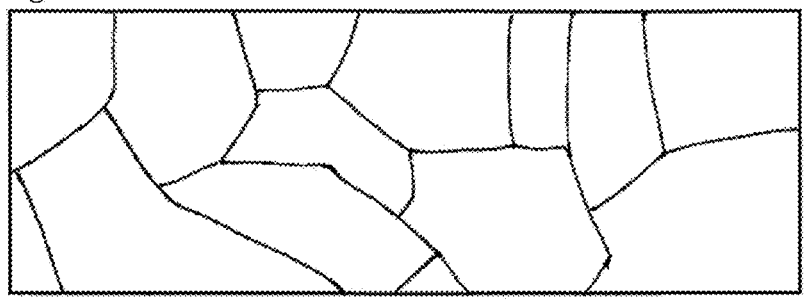
FIG. 4 indicates a cross-section view showing a frame format of the indium target according to FIG. 2.

The indium target of the present invention is formed in the shape of rectangular or circular sheet having the thickness of 5 to 30 mm. As described in FIG. 1, granular structures are formed all over the indium target of the present invention, and an aspect ratio (length of longer direction/length of shorter direction), of each crystal particle, is 2.0 or less. The length of longer direction of crystal particle, used in the specification of aspect ratio of each crystal particle, is the maximum length observed from cross-section surface in thickness direction of the target. The length of longer direction of crystal particle, used in the specification of aspect ratio of each crystal particle, is the maximum length of the crystal particle in a direction perpendicular to the maximum length of longer direction. FIG. 1 indicates a cross-section photo of the indium target (a cross-section photo in thickness direction of the target), formed by rolling the ingot provided in the after-described casting step of the indium target. FIG. 2 indicates a cross-section photo of the indium target formed by a traditional casting method. FIG. 3 indicates a cross-section view showing a frame format of the indium target according to FIG. 1. FIG. 4 indicates a cross-section view showing a frame format of the indium target according to FIG. 2.

In this way, mixed structures of granular and columnar crystals of the indium ingot, formed by pouring molten indium into a mold and then cooling the molten indium, are destroyed by rolling the indium ingot, and thereby recrystallization proceeds. As a result, when observed from cross-section direction of the target, small crystal particles where the aspect ratio is 2.0 or less, are formed all over the target. Therefore, deposition rate can be high, initial discharge voltage can be low, and deposition rate and discharge voltage, from the start of sputtering to the end of sputtering, can be stable. On the other hand, mixed structures of granular and columnar crystals exist in an indium target, formed by leaving it to cool, in the traditional melting and casting method, because the cooling is not homogeneous in each part. That is, columnar crystals, extending from all ends of top surface, side surfaces and bottom surface, exist in the target. Further, granular crystals exist in central part of the target. Depending on directions of columnar crystals, and locations of crystal faces and granular crystals, such targets are subjected to inhomogeneous erosion, spattering characteristic also becomes unstable with time and deposition rate becomes low.

Aspect ratio of crystal particle is preferably 1.8 or less, and typically 1.0 to 1.6.

Average crystal particle size of indium target of the present invention may be 1 to 20 mm. In this way, by reducing the particle size to 1 to 20 mm, a total number of particles existing in the sputtering surface increases and variability of sputtering property, depending on a direction of crystal to be sputtered, can be offset. As a result, deposition rate and discharge voltage, of the sputtering using the target, from the start of sputtering to the end of sputtering, can be more stable, deposition rate can be high and initial discharge voltage can be low. Average crystal particle size is preferably 1 to 15 mm, more preferably 1 to 10 mm and typically 2 to 8 mm.

As described above, deposition rate, of the indium target of the present invention, is high and stable. In particular, the indium target of the present invention has deposition rate of 4000 Å/min or more, more preferably 5000 Å/min or more, typically 5000 to 6000 Å/min, under the sputtering condition of power density: 2.0 W/cm$^2$, gas pressure: 0.5 Pa, and used gas: Ar 100%. Further, in the indium target of the present invention, the percentage of change of the deposition rate per 1 kWh of integrated electricity, from the start of sputtering to the end of sputtering, is within 0.5%, more preferably within 0.3%, typically within 0.4%.

As described above, the initial discharge voltage, of the indium target of the present invention, is low, and discharge voltage, from the start of sputtering to the end of sputtering, is stable. In particular, the initial discharge voltage, of the indium target of the present invention, is 350V or less, more preferably 340V or less, typically 300 to 345V, under the sputtering condition of power density: 2.0 W/cm$^2$, gas pressure: 0.5 Pa, and used gas: Ar 100%. In the indium target of the present invention, the percentage of change of the discharge voltage per 1 kWh of integrated electricity, from the start of sputtering to the end of sputtering, is within 0.2%, more preferably within 0.1%, typically 0.01 to 0.15%, under the sputtering condition of power density: 2.0 W/cm$^2$, gas pressure: 0.5 Pa, and used gas: Ar 100%.

In the indium target of the present invention, the sum density, of one or more metals selected from the group consisting of Cu, Ni and Fe, derived from backing plate, is 100 wtppm or less. Mixing impurities in the target can be inhibited excellently by the manufacturing method of the present invention. As a result, impurity level of the target can be as same as that of the ingot used as a raw material. Traditional casting methods are conducted on the backing plate. Therefore, impurities diffuse from the backing plate, thereby efficiency of a solar cell, made from the indium target, becomes low. Further, depending on casting time, a concentration of impurities changes. As a result, a between-lot variation of qualities becomes large. The method of the present invention can inhibit such a variation of qualities. The sum density, of one or more metals selected from the group consisting of Cu, Ni and Fe, is more preferably 20 wtppm or less.

Next, an appropriate example of a manufacturing method, of the indium target of the present invention, will be explained step by step. At first, raw indium is melted and then poured into a mold. Raw indium for use preferably has high purity because if the raw indium includes impurities, conversion efficiency of a solar cell, made from the raw indium, becomes low. For example, raw indium, having purity of 99.99 mass % or more, can be used.

Next, raw indium poured into the mold is cooled and then indium ingot is produced. At this time, it may be left to cool, or it may be cooled at high cooling rate, by using a refrigerant, for promotion of a manufacturing process. A refrigerant to be used, for example, may be cool air, water, oil, alcohol and the like. When cool air is used, raw indium is cooled directly or indirectly. When water, oil, alcohol and the like are used, raw indium is cooled indirectly. Cooling by using a refrigerant may be conducted from top surface of raw indium poured into the mold as well as from side surfaces and/or bottom surface of the raw indium.

Next, the produced indium ingot is rolled at least twice, under the conditions of total rolling reduction of 20% or more and each rolling reduction of 5 to 30%. Rolling reduction doesn't have to be same each time and it may be changed. The rolling may be cold rolling or hot rolling. By this rolling, mixed structures of granular and columnar crystals of the indium ingot are destroyed and then recrystallization proceeds, thereby crystal particles where the aspect ratio is 2.0 or less, are formed all over the target. Further, if necessary, the recrystallization may be promoted by annealing and the like. In addition, acid wash and degreasing may be conducted. Further, if necessary, cutting operation for any desired shape, may be conducted with machining center, turning machine, scraper and the like. In this way, indium tile is produced. Next, the indium target is produced by bonding this indium tile on a backing plate.

The indium target produced like this, can be appropriately used as sputtering target for photoabsorption layer of CIGS system thin-film solar cell.

EXAMPLES

Examples of the present invention will be described as follows, but the following examples are provided for better understanding of the present invention and its advantages, and intended to be non-limiting.

Working Example 1

Raw indium (purity: 4N) melted at 180° C. was poured into a mold made of SUS, of 250 mm long, 160 mm wide, 80 mm deep (inside dimension) to a depth of 39 mm. Next, the mold was cooled with water from the environment and then ingot was produced. Next, the ingot of 39 mm thick was rolled with reducing 3 mm thick each time, and then a tile of 6 mm thick was produced. This tile was cut to be discoid shape of 205 mm in diameter. Next, the tile was bonded on a backing plate, made of copper, of 250 mm in diameter and 5 mm thick, and then produced to be discoid shape of 204 mm in diameter and 6 mm thick with turning machine. In this way, indium target was produced.

Working Example 2

Indium target was produced in a manner similar to the working example 1, except that refrigerant was not used and raw indium in the mold was left to cool.

Working Example 3

Indium target was produced in a manner similar to the working example 1, except that ingot of 18 mm thick was produced and then a tile of 6 mm thick was produced by rolling with reducing 3 mm thick each time.

Working Example 4

Indium target was produced in a manner similar to the working example 1, except that ingot of 60 mm thick was produced and then a tile of 6 mm thick was produced by rolling with reducing 3 mm thick each time.

Working Example 5

Indium target was produced in a manner similar to the working example 1, except that ingot of 20 mm thick was produced and then a tile of 6 mm thick was produced by rolling with reducing 3 mm thick each time.

Working Example 6

Indium target was produced in a manner similar to the working example 1, except that ingot of 8.2 mm thick was produced by leaving raw indium in a mold to cool without using a refrigerant, and then a tile of 6 mm thick was produced by rolling the ingot at rolling reduction of 10%.

Working Example 7

Indium target was produced in a manner similar to the working example 1, except that ingot of 17.5 mm thick was produced by leaving raw indium in a mold to cool without using a refrigerant, and then a tile of 6 mm thick was produced by rolling the ingot at rolling reduction of 30%.

Comparative Example 1

A mold was formed on a copper backing plate of 250 mm in diameter and 5 mm thick, and then raw indium (purity: 4N) melted at 180° C. was poured into the mold to a depth of 39 mm. Next, the mold was cooled with water from the environment and then indium target having a discoid shape of 204 mm in diameter and 6 mm thick was produced.

Comparative Example 2

Indium target was produced in a manner similar to the comparative example 1, except that the mold, where raw indium was poured, was cooled with cool air from the environment.

Comparative Example 3

Indium target was produced in a manner similar to the comparative example 1, except that the mold, where raw indium was poured, was left to cool at the room temperature of 30° C.

Comparative Example 4

Indium target was produced in a manner similar to the comparative example 1, except that the mold, where raw indium was poured, was left to cool at the room temperature of 15° C.

(Evaluation)
[Aspect Ratio of Crystal Particle]

The indium targets, produced in working examples and comparative examples, were heated to 150 to 156° C. Next, both sides of parts, where cross-section observation was to be conducted, of the targets, were held just before they were melted, and then cross-section surfaces were exposed by breaking the targets with bending or folding them. "Just before they were melted" as described above means the point when temperatures of parts, which will be fracture surfaces of the targets, become 156° C. The indium that reached 156° C. are very likely to break along the line of grain boundary. Accordingly, in addition to the above described bending and folding, loads such as patting, pulling and pushing, may apply to the targets. The above described loads may be applied to the target with holding the target by hands or a tool such as a pincher. The crystal structures of the cross-section surface were photographed by a digital camera, and then aspect ratio of the crystal particles were evaluated from the images.

In traditional observation methods, the crystal structures of the above described cross-section surface of the indium target cannot be observed accurately. That is, in a traditional observation method, where a cross-section surface is exposed by cutting, the crystal particle boundary cannot be observed because the cutting surface itself is gliding. Accordingly, it is necessary to conduct etching additionally in order to expose the crystal particle boundary. In such a method, when cutting is conducted, original crystal particle boundaries cannot be observed because strains are generated and recrystallized in the surface. There is an exposure by breaking after liquid nitrogen cooling among exposures of the surface. However, such a method cannot be conducted for the indium target of the present invention because the indium target of the present invention cannot be broken by conducting liquid nitrogen cooling. On the other hand, in the present invention, the original crystal particle boundary can be observed accurately because the crystal structure of cross-section surface of the indium target is observed by the above described method.

[Average Crystal Particle Size]

The following is a measuring method for average crystal particle size in cross-section surface in thickness direction of the indium target produced in working examples and comparative examples. The cross-section surface was photographed by a digital camera, and then the number (N), of the crystal particles existing in a random area (rectangle, 5mm$^2$ in area) in cross-section surface of the image, was counted. In the counting, the crystal particle existing astraddle the area boundary was counted as 0.5 and the crystal particle existing astraddle the corner of the area was counted as 0.25. Average area (s) of the crystal particles was calculated by dividing area (S) of a part to be measured by N. Next, the average crystal particle size was calculated by the following formula on the assumption that the crystal particle is sphere.

$$A = 2(s/\pi)^{1/2}$$

[Concentration of Impurities]

A concentration of impurities (a concentration of copper derived from backing plate) of the indium targets produced in working examples and comparative examples was evaluated by ICP emission spectrometry (Seiko Instrument, SPS3000 ICP emission spectrometry equipment).

[Sputtering Property]

With respect to the indium targets produced in working examples and comparative examples, temporal change of deposition rate and discharge voltage, from the start of sputtering (the initial stage of sputtering), was observed. In particular, continuous sputtering was conducted under the following condition, discharge voltage was measured by a voltmeter attached to the sputtering equipment every 4 kWh, a film was formed for 3 minutes after changing plates, and then a film thickness was measured. Dektak8 manufactured by ULVAC was used for the measurement of the film thickness. In the following sputtering condition, "input sputtering power density" indicates the value obtained by dividing applied power at sputtering by the area of sputtering surface of the target.

Figure 5:
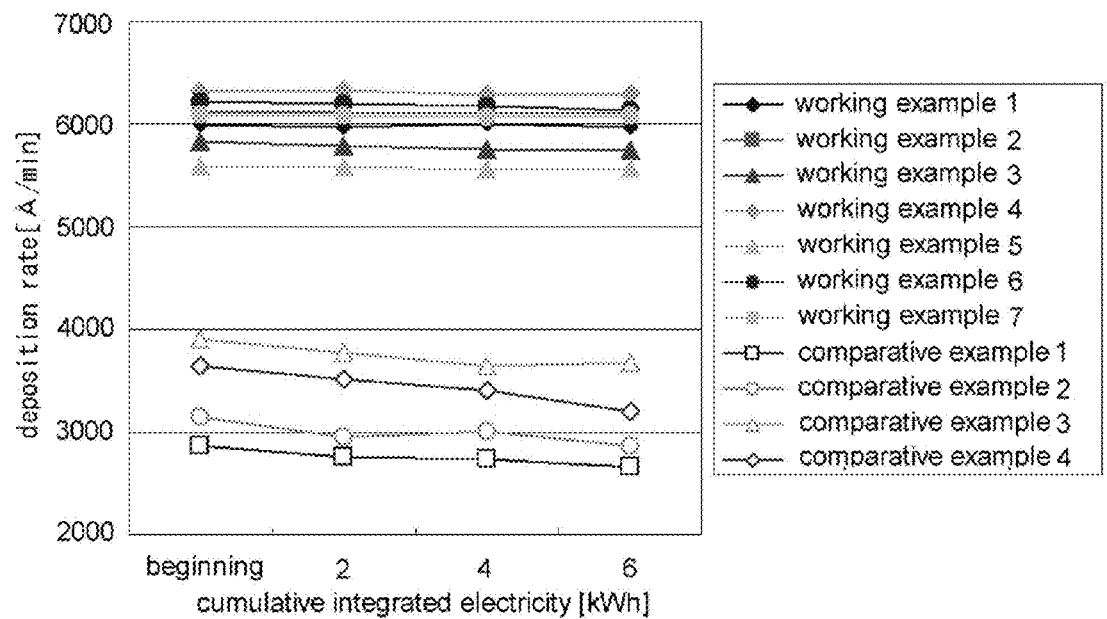
FIG. 5 indicates a graph showing evaluation results of deposition rates of working examples and comparative examples.
Figure 6:
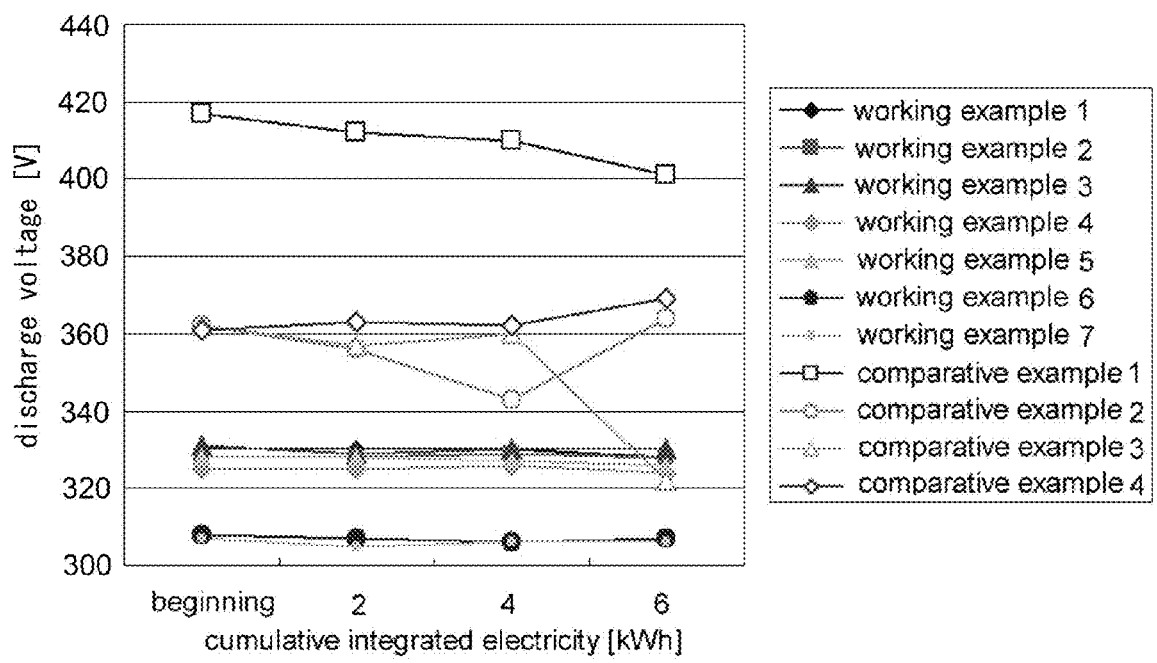
FIG. 6 indicates a graph showing evaluation results of discharge voltage of working examples and comparative examples.

The following is the sputtering condition.
Sputtering equipment: Canon ANELVA, SPF-313H
Target size: φ 8 inch×5 mmt
Sputtering gas: Ar
Sputtering gas pressure: 0.5 Pa
Sputtering gas flow: 50 SCCM
Sputtering temperature: R.T. (without heating)
Input sputtering power density: 2.0 W/cm$^2$
Basal plate: EAGLE2000 manufactured by Corning, φ 4 inch×0.7 mmt Each measuring condition and result are shown in Tables 1 and 2. Graphs showing evaluation results of deposition rates and discharge voltage in Table 2 are shown in FIGS. 5 and 6.

TABLE 1

| | Aspect ratio | Average crystal particle size [mm] | Concentration of impurities (total of Cu, Fe, Ni) [wtppm] | Conditions of rolling and casting |
|---|---|---|---|---|
| Working example 1 | 1.5 | 2.5 | 5 | water cooling, rolling from 39 mm to 6 mm thick with reducing 3 mm thick each time |
| Working example 2 | 1.2 | 3.0 | <1 | leaving to cool, rolling from 39 mm to 6 mm thick with reducing 3 mm thick each time |
| Working example 3 | 1.3 | 5.5 | 2 | water cooling, rolling from 18 mm to 6 mm thick with reducing 3 mm thick each time |
| Working example 4 | 1.2 | 3.0 | <1 | water cooling, rolling from 60 mm to 6 mm thick with reducing 3 mm thick each time |
| Working example 5 | 1.1 | 5.5 | <1 | water cooling, rolling from 20 mm to 8 mm thick with reducing 3 mm thick each time |
| Working example 6 | 1.0 | 8.5 | 1 | leaving to cool, rolling three times from 8.2 mm to 6 mm thick with each rolling reduction of 10% |
| Working example 7 | 1.1 | 6.0 | <1 | leaving to cool, rolling three times from 17.5 mm to 6 mm thick with each rolling reduction of 30% |
| Comparative example 1 | 10.0 | 1.8 | 500 | setting a mold on a backing plate, pouring raw indium, water cooling from side surfaces of target |
| Comparative example 2 | 5.0 | 4.2 | 388 | setting a mold on a backing plate, pouring raw indium, air cooling from side surfaces of target |
| Comparative example 3 | 4.0 | 50.0 | 2300 | setting a mold on a backing plate, pouring raw indium, leaving to cool at room temperature 30° C. |
| Comparative example 4 | 2.5 | 35.0 | 1500 | setting a mold on a backing plate, pouring raw indium, leaving to cool at room temperature 15° C. |

TABLE 2

|  | Total rolling reduction [%] | Deposition rate [Å/min] | | | | Percentage of change of deposition rate [%] | Percentage of change per 1 kWh of integrated electricity [%] | Discharge voltage [%] | | | | Percentage of change of discharge voltage [%] | Percentage of change per 1 kWh of integrated electricity [%] |
| --- | --- | --- | --- | --- | --- | --- | --- | --- | --- | --- | --- | --- | --- |
|  |  | At beginning | At 4 kWh | At 8 kWh | At 12 kWh |  |  | At beginning | At 4 kWh | At 8 kWh | At 12 kWh |  |  |
| Working example 1 | 85 | 5990 | 5970 | 6000 | 5970 | 0.4 | 0.03 | 330 | 330 | 330 | 328 | 0.6 | 0.05 |
| Working example 2 | 85 | 6120 | 6110 | 6100 | 6110 | 0.9 | 0.07 | 328 | 328 | 329 | 328 | 0.3 | 0.03 |
| Working example 3 | 67 | 5830 | 5790 | 5760 | 5750 | 1.4 | 0.11 | 331 | 329 | 330 | 330 | 0.6 | 0.05 |
| Working example 4 | 90 | 6320 | 6330 | 6290 | 6300 | 0.2 | 0.01 | 325 | 325 | 326 | 324 | 0.3 | 0.03 |
| Working example 5 | 60 | 5590 | 5580 | 5560 | 5570 | 0.5 | 0.04 | 328 | 328 | 327 | 326 | 0.6 | 0.05 |
| Working example 6 | 26 | 6220 | 6200 | 6180 | 6130 | 1.4 | 0.12 | 308 | 307 | 306 | 307 | 0.6 | 0.05 |
| Working example 7 | 66 | 6090 | 6080 | 6070 | 6080 | 0.8 | 0.06 | 307 | 305 | 306 | 306 | 0.7 | 0.05 |
| Comparative example 1 | 0 | 2870 | 2760 | 2740 | 2660 | 11.1 | 0.93 | 417 | 412 | 410 | 401 | 3.8 | 0.32 |
| Comparative example 2 | 0 | 3150 | 2950 | 3010 | 2870 | 5.9 | 0.49 | 362 | 356 | 343 | 364 | 5.2 | 0.44 |
| Comparative example 3 | 0 | 3910 | 3780 | 3650 | 3680 | 11.8 | 0.99 | 362 | 357 | 360 | 322 | 11.0 | 0.92 |
| Comparative example 4 | 0 | 3650 | 3520 | 3410 | 3200 | 12.0 | 1.00 | 361 | 363 | 362 | 369 | 2.2 | 0.18 |

In all of working examples 1 to 7, deposition rate was higher, initial discharge voltage was lower, and deposition rate and discharge voltage, from the start of sputtering to the end of sputtering, were more stable, compared to comparative examples using the traditional casting method.

In all of comparative examples 1 to 4, aspect ratio of the crystal particle was over 2.0, deposition rate was low, initial discharge voltage was high, and deposition rate and discharge voltage, from the start of sputtering to the end of sputtering, were unstable.

What is claimed is:

1. A sputtering target consisting essentially of indium, wherein an aspect ratio (length of longer direction/length of shorter direction) of the crystal particles, observed from a cross-section direction of the target, is 1.8 or less.

2. The sputtering target of claim 1, wherein the average crystal particle size is 1 to 20 mm.

3. The sputtering target of claim 1 or 2, having a deposition rate of 4000 Å/min or more, under the sputtering condition of power density: 2.0 W/cm$^2$, gas pressure: 0.5 Pa, and used gas: Ar 100%.

4. The sputtering target of claim 1 or 2, wherein the percentage of change of the deposition rate per 1 kwh of integrated electricity, from the start of sputtering to the end of sputtering, is within 0.5%, under the sputtering condition of power density: 2.0 W/cm$^2$, gas pressure: 0.5 Pa, and used gas: Ar 100%.

5. The sputtering target of claim 1 or 2, wherein the initial discharge voltage is 350V or less, under the sputtering condition of power density: 2.0 W/cm$^2$, gas pressure: 0.5 Pa, and used gas: Ar 100%.

6. The sputtering target of claim 1 or 2, wherein the percentage of change of the discharge voltage per 1 kwh of integrated electricity, from the start of sputtering to the end of sputtering, is within 0.2%, under the sputtering condition of power density: 2.0 W/cm$^2$, gas pressure: 0.5 Pa, and used gas: Ar 100%.

7. The sputtering target of claim 1 or 2, wherein the sum density, of one or more metals selected from the group consisting of Cu, Ni and Fe, is 100 wtppm or less.

8. A sputtering target consisting essentially of indium, wherein an aspect ratio (length of longer direction/length of shorter direction) of the crystal particles, observed from a cross-section direction of the target, is 2.0 or less and the average crystal particle size is 1 to 20 mm.

9. The sputtering target of claim 8, having a deposition rate of 4000 Å/min or more, under the sputtering condition of power density: 2.0 W/cm$^2$, gas pressure: 0.5 Pa, and used gas: Ar 100%.

10. The sputtering target of claim 8, wherein the percentage of change of the deposition rate per 1 kwh of integrated electricity, from the start of sputtering to the end of sputtering, is within 0.5%, under the sputtering condition of power density: 2.0 W/cm$^2$, gas pressure: 0.5 Pa, and used gas: Ar 100%.

11. The sputtering target of claim 8, wherein the initial discharge voltage is 350V or less, under the sputtering condition of power density: 2.0 W/cm$^2$, gas pressure: 0.5 Pa, and used gas: Ar 100%.

12. The sputtering target of claim 8, wherein the percentage of change of the discharge voltage per 1 kwh of integrated electricity, from the start of sputtering to the end of sputtering, is within 0.2%, under the sputtering condition of power density: 2.0 W/cm$^2$, gas pressure: 0.5 Pa, and used gas: Ar 100%.

13. The sputtering target of claim 8, wherein the sum density, of one or more metals selected from the group consisting of Cu, Ni and Fe, is 100 wtppm or less.

* * * * *

UNITED STATES PATENT AND TRADEMARK OFFICE
CERTIFICATE OF CORRECTION

| | | |
|---|---|---|
| PATENT NO. | : 9,139,900 B2 | Page 1 of 1 |
| APPLICATION NO. | : 13/504329 | |
| DATED | : September 22, 2015 | |
| INVENTOR(S) | : Yousuke Endo et al. | |

It is certified that error appears in the above-identified patent and that said Letters Patent is hereby corrected as shown below:

On the title page of the patent item (73) Assignee is incorrectly listed;

"JX Nippon Mining Metals Corporation, Tokyo (JP)"

should read

-- JX Nippon Mining & Metals Corporation, Tokyo (JP) --

Signed and Sealed this
First Day of March, 2016

Michelle K. Lee
*Director of the United States Patent and Trademark Office*